United States Patent [19]

Kagamida

[11] Patent Number: 5,582,536
[45] Date of Patent: Dec. 10, 1996

[54] APPARATUS AND METHOD FOR MANUFACTURING WAFER

[75] Inventor: Takeshi Kagamida, Mitaka, Japan

[73] Assignee: Tokyo Seimitsu Co., Ltd., Mitaka, Japan

[21] Appl. No.: 415,509

[22] Filed: Apr. 3, 1995

[30] Foreign Application Priority Data

Jun. 2, 1994 [JP] Japan ................................. 6-121436

[51] Int. Cl.⁶ .................................................. B24B 1/00
[52] U.S. Cl. ............................... 451/56; 451/21; 451/28; 125/11.03; 125/13.02
[58] Field of Search ............................ 451/11, 180, 14, 451/5, 26, 28, 72, 43, 44; 125/13.02, 13.01, 11.03, 23.01, 12

[56] References Cited

U.S. PATENT DOCUMENTS

| | | | |
|---|---|---|---|
| 4,344,260 | 8/1982 | Ogiwara | 451/44 |
| 4,852,304 | 8/1989 | Honda et al. | 125/13 R |
| 4,896,459 | 1/1990 | Brandt | 125/13.01 |
| 5,000,156 | 3/1991 | Honda et al. | 125/11.03 |
| 5,074,276 | 12/1991 | Katayama | 125/13.02 |
| 5,128,281 | 7/1992 | Dyer et al. | |
| 5,274,959 | 1/1994 | Dyer et al. | |
| 5,295,331 | 3/1994 | Honda et al. | 451/44 |
| 5,351,446 | 10/1994 | Langsdorf | 125/13.02 |
| 5,409,417 | 4/1995 | Bando | 451/44 |
| 5,427,644 | 6/1995 | Nagatsuka et al. | 125/13.02 |

FOREIGN PATENT DOCUMENTS

| | | | |
|---|---|---|---|
| 601748 | 6/1994 | European Pat. Off. | |
| 404211908 | 8/1992 | Japan | 125/12 |
| 404211907 | 8/1992 | Japan | 125/12 |

*Primary Examiner*—Bruce M. Kisliuk
*Assistant Examiner*—Derris H. Banks
*Attorney, Agent, or Firm*—Oliff & Berridge

[57] ABSTRACT

It is an object of the present invention to provide an apparatus and a method for manufacturing a wafer, which are the most suitable for meeting the requirement for the mirror grinding surface of the wafer's chamfering portion. As a result, when the ingot is sliced, a wafer being sliced is chamfered at the same time. And, it is also possible that before the ingot starts to be sliced by the blade, the grindstone is pressed against the outer periphery of the slicing position to form a V-shaped groove along the outer periphery of the slicing position, so that the chamfering can be performed.

8 Claims, 7 Drawing Sheets

APPARATUS AND METHOD FOR MANUFACTURING WAFER

BACKGROUND OF THE INVENTION

1. Field of the Invention

The present invention relates to an apparatus and a method for manufacturing a wafer and more particularly to an apparatus and a method for manufacturing a wafer which can improve an efficiency in manufacturing a wafer.

2. Description of the Related Art

Conventionally, a slicing machine is used for slicing an ingot into wafers. In the slicing machine, the ingot is fixed at a feed table of the machine, which feeds an ingot in the feed direction, and after lowering an ingot to a slicing position of a blade (an inner periphery blade is generally used) against the rotating blade by means of an index mechanism of the feed table, presses the ingot against the blade and slices the ingot into sheet wafers by feeding the feed table in the slicing direction. A rotating ingot slicing machine is known, which presses a rotating ingot against a rotating blade, and this machine is characterized by shortening the time for slicing.

And, the outer periphery of the sliced wafer is formed as edge (the outer periphery of the wafer is substantially perpendicular to a slicing face of the wafer), so that chipping or a small nick easily appear, and because the wafer easily cracks due to the small shock on the outer periphery thereof, the rate of yield for manufacturing a wafer lowers. Therefore, the outer periphery of the wafer is chamfered before lapping the cutting face of the wafer with a lapping machine, so that the chipping and the cracking of the wafer can be prevented. And, conventionally, an edge grinding machine is provided between the slicing machine and the lapping machine, so that the outer periphery of the sliced wafer is chamfered. However, in the case that the lapping is performed after the chamfering as in the conventional way, since the chamfering is carried out after the chamfering portion of the outer periphery of the wafer is leveled by the rough chamfering by a grindstone #800 and the final chamfering by a grindstone #1500, the chamfering portion, which has been leveled, is like a surface ground by #800. Therefore, the chamfered portion in a good condition, which has been ground by #1500, cannot be maintained to the end of the process. As a result, there is a problem in that because there has to be a step of the rough chamfering before the lapping and a step of the final chamfering after the lapping in order to meet the requirement for the mirror grinding surface of the wafer's chamfering portion, one more step is required and the efficiency in manufacturing the wafer is lowered.

SUMMARY OF THE INVENTION

The present invention has been developed under the above-described circumstances, and has its aim the provision of an apparatus and a method for manufacturing a wafer which can improve efficiency in manufacturing a wafer and are the most suitable for meeting the requirement for the mirror grinding surface of the wafer's chamfering portion. To achieve the above-described object, in the present invention, an ingot being rotated is pressed against a rotating blade to be sliced into sheet wafers, and while the ingot is sliced, a grindstone having an appropriate shape for chamfering is pressed against the outer periphery of the slicing groove, so that the wafer being sliced can be chamfered.

According to the present invention, while the rotating ingot is sliced while being pressed against the rotating blade, the grindstone having an appropriate shape for chamfering is pressed against the outer periphery of the slicing groove. Or, before the ingot is sliced, the grindstone is pressed against the outer periphery of the cutting position, so that a V-shaped groove is formed along the outer periphery of the slicing position. Thus, when the ingot is sliced by the blade, a wafer sliced from the ingot can be chamfered at the same time.

Moreover, since copy means is provided, which performs the chamfering by copying the grindstone with the periphery shape of the ingot, the ingot with an orientation flat can be accurately chamfered.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENT

Detailed description will hereunder be given of the preferred embodiment of an apparatus and a method for manufacturing a wafer according to the present invention with reference to the accompanying drawings.

Figure 1:
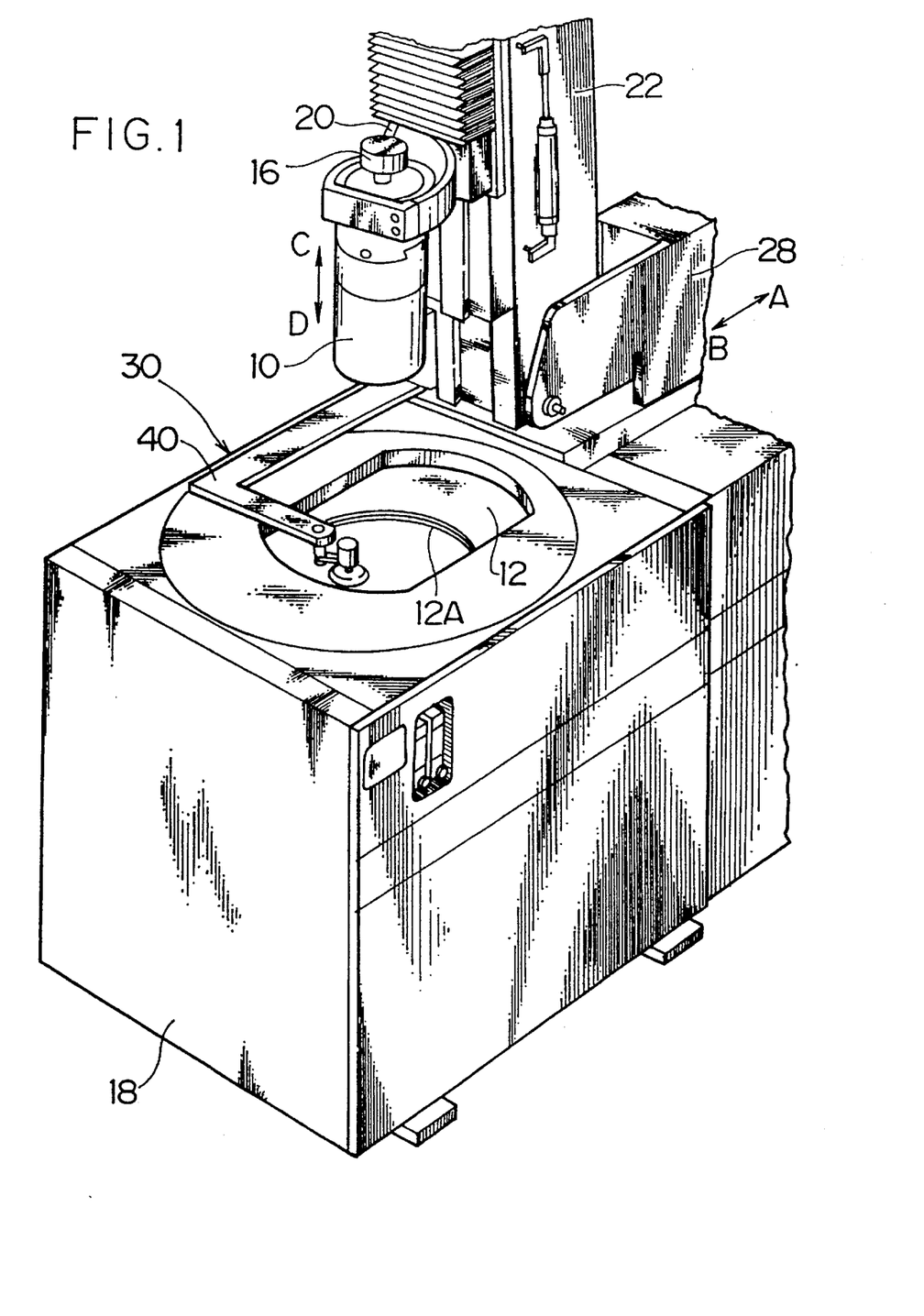
FIG. 1 is a perspective view illustrating the structure of a wafer manufacturing apparatus according to the present invention.

FIG. 1 is a perspective view illustrating the structure of an apparatus for manufacturing a wafer according to the present invention. This apparatus for manufacturing the wafer mainly comprises a main body 18 provided with an inner periphery blade 12 whose edge portion 12A is formed at an inner periphery edge for slicing a columnar ingot 10, an index slider 20 for fixing the end of the ingot 10 and moving the ingot 10 vertically, a column 22 provided with a motor 16 which rotates the ingot 10, a feed table 28 provided with a chamfering machine 30 which chamfers the periphery of the cutting surface of the ingot 10 being sliced. That is, the wafer manufacturing apparatus of the present invention has a function of slicing the ingot 10 and a function of chamfering the wafer being sliced from the ingot 10 in one body.

Figure 7:
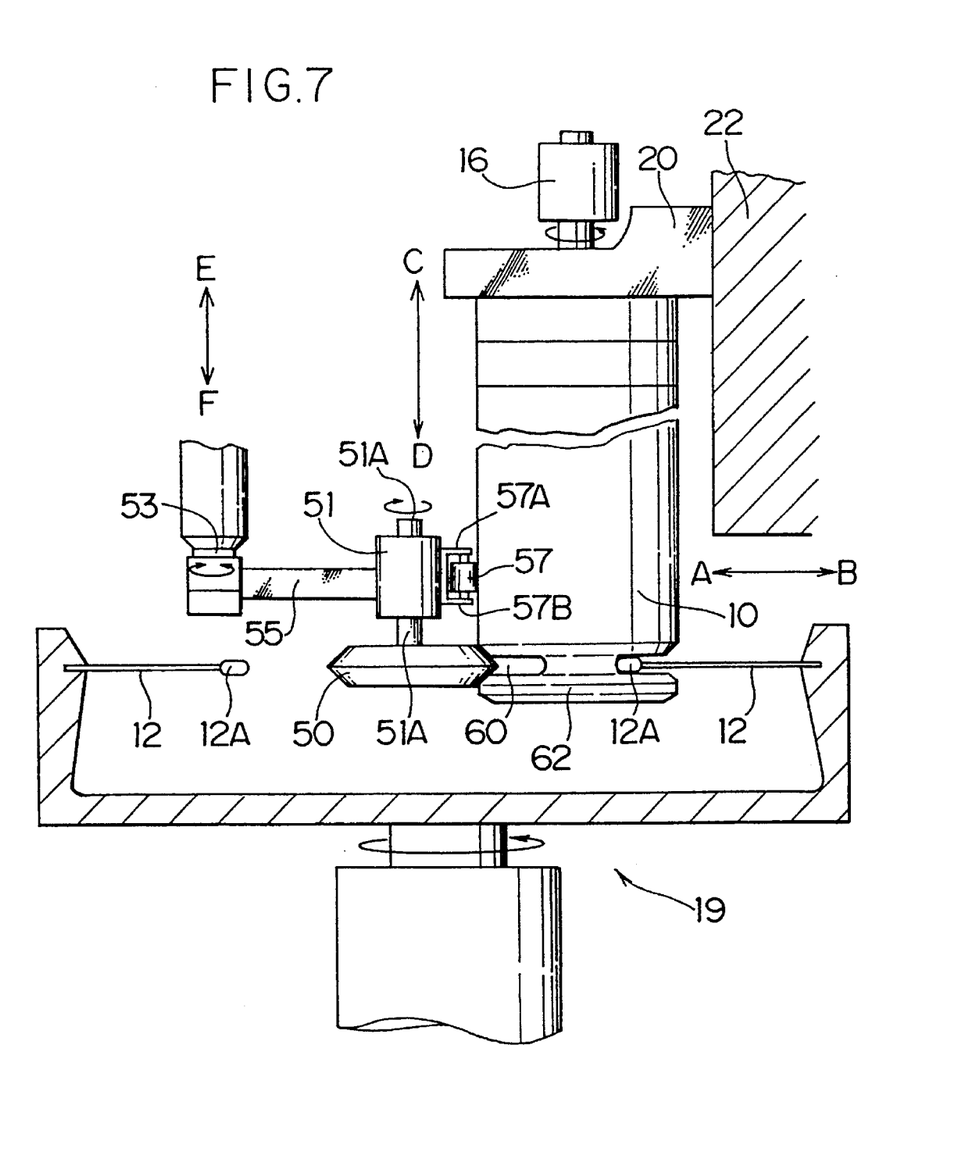
FIG. 7 is an explanatory view explaining an operation of an apparatus for manufacturing a wafer according to the present invention.

The inner periphery blade 12 is fixed at the top part of a rotating body 19 as shown in FIG. 7 and can rotate at high speed, and after the ingot moves down in the direction of an arrow D by means of the index slider 20 of the feed table 28, the feed table 28 moves in the direction of an arrow a while the motor 16 is rotating the ingot 10, so that the ingot 10 is sliced into sheet wafers.

Figure 2:
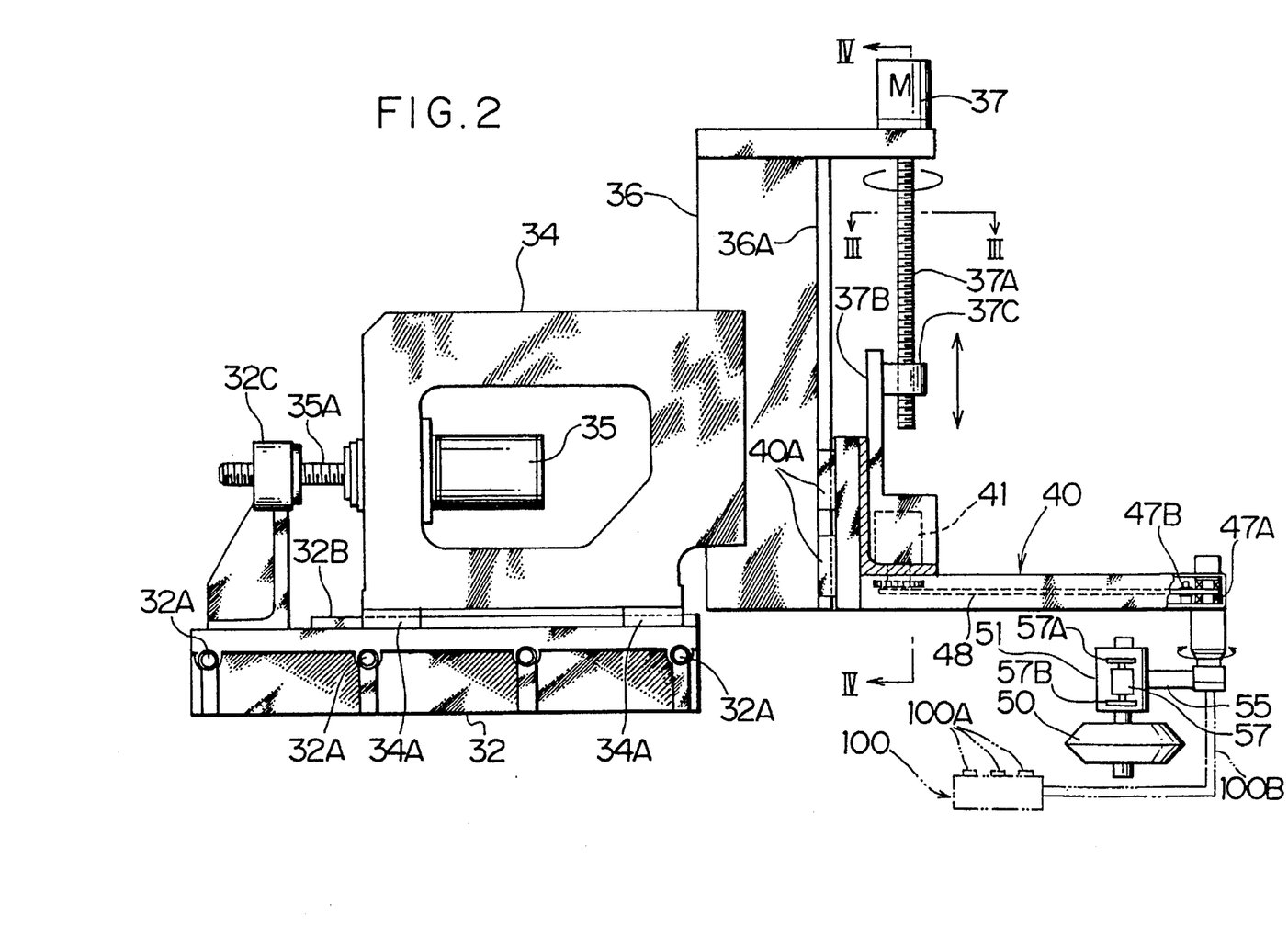
FIG. 2 is an explanatory view explaining the entire structure of a chamfering machine.

Next, an explanation will be given of the chamfering machine 30 with reference to FIG. 2. The chamfering machine 30 mainly comprises a base 32, a slider 34 sliding on the base 32, a column 36 fixed at the slider 34, an arm 40 moving along the column 36, a grindstone 50 rotatably attached at the end of the arm 40, and a grindstone motor 51 rotating the grindstone 50. The base 32 is fixed at the feed table 28 by a bolt 32A, etc. And, a guide rail 32B and a nut member 32C are fixed on the base 32.

The slider 34 has a linear bearing 34A running on the guide rail 32B and a stepping motor 35, and the stepping motor 35 can rotate a lead screw 35A screwed on the nut member 32C. Thus, when the stepping motor 35A rotates the lead screw 35A, the slider 34 can move horizontally on the base 32 as shown in FIG. 2.

Moreover, a guide rail 36A is vertically arranged at the column 36, and a normal-reverse rotating motor 37 is provided at the upper part of the column. A screw rod 37A is arranged along the guide rail 36A, and the upper end of the screw rod 37A is supported by the normal-reverse rotating motor 37, and it is screwed in the nut member 37C fixed at a supporting member 37B, which supports the arm 40. The supporting member 37B is movably supported on the guide rail 36A through a linear bearing 40A. Therefore, when the normal-reverse rotating motor 37 runs, the arm 40 supported by the supporting member 37B can horizontally move along the guide rail 36A by means of a feed screw mechanism of the screw rod 37A and the nut member 37C.

Figure 3:
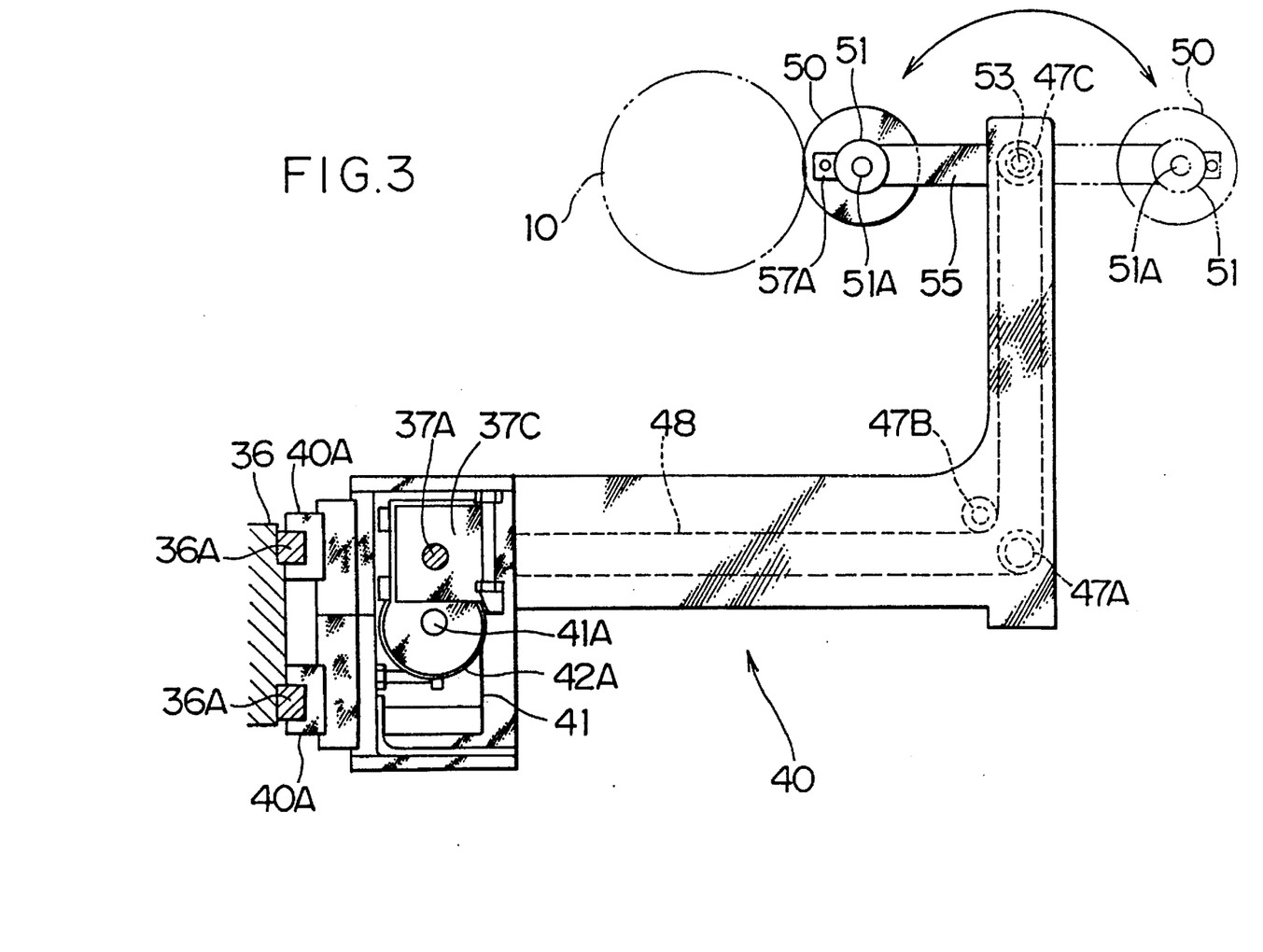
FIG. 3 is a sectional view taken on line III—III of FIG. 2.
Figure 4:
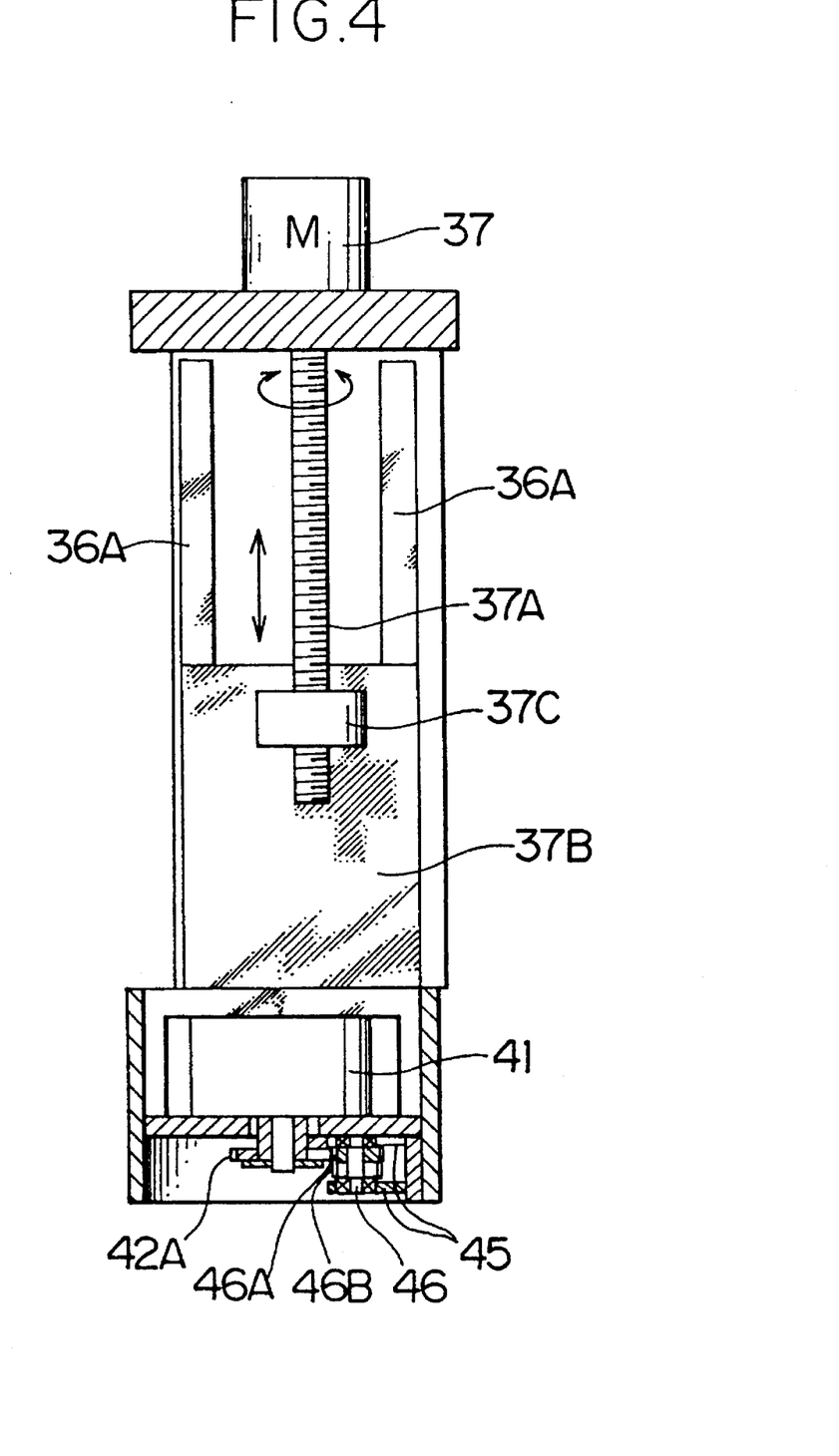
FIG. 4 is a sectional view taken on line IV—IV of FIG. 2.

Next, an explanation will be given of the arm 40 and the grindstone 50 with reference to FIGS. 3 and 4. A rotary actuator 41 is fixed at the end of the arm 40, a gear 42A is provided at the upper end of a drive axis 41A of the rotary actuator 41. The gear 42A is screwed on a gear 46A, which is fixed at an axis 46 rotatably supported by means of a bearing member 45.

And, pulleys 47A and 47B for guiding are provided at the corner of the arm 40, and a pulley 47C is provided at the tip of the arm 40 turning an arm 55 for a grindstone. The pulley 47C is fixed at a rotation axis 53. These pulleys 46B, 47A, 47B, and 47C are bound with a timing belt 48. And, one end of the arm 55 for a grindstone, which is substantially perpendicular to the rotation axis 53 (horizontally), is fixed at the bottom part of the rotation axis 53, and another end supports the grindstone motor 51. The bead-shaped grindstone 50 is attached at the tip of a rotation axis 51A of the motor 51. The roller 57 having an elastic member such as rubber is rotatably supported between an upper plate 57A and a lower plate 57B, which protrude from the top and bottom side of the grindstone motor 51.

Figure 5:
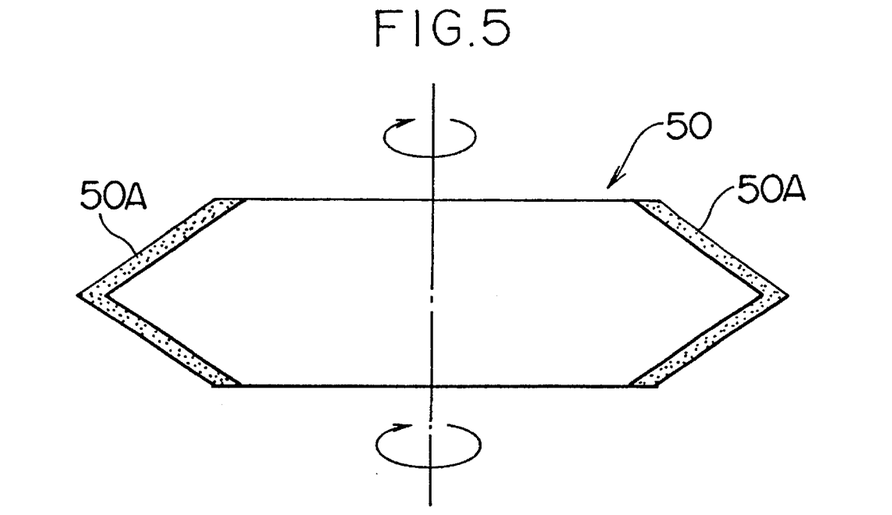
FIG. 5 is a sectional view illustrating one example of a grindstone's shape.
Figure 6:
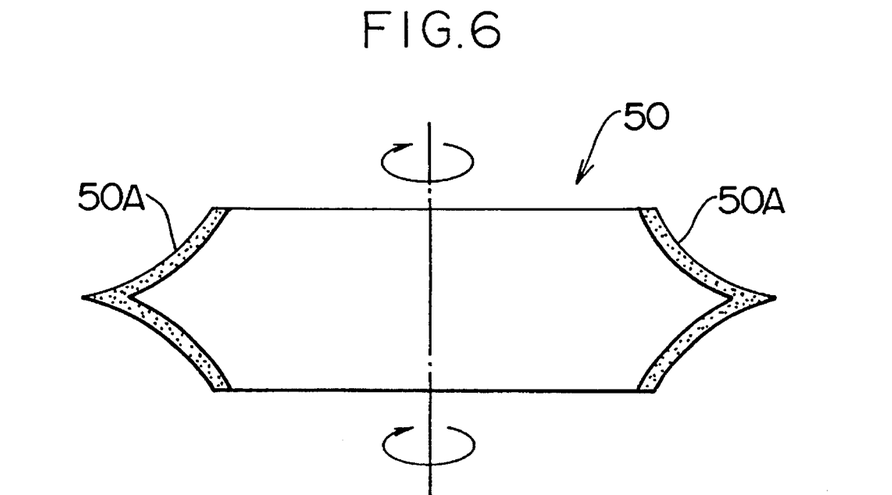
FIG. 6 is a sectional view illustrating another example of a grindstone's shape.

Accordingly, when a drive axis 41A of the rotary actuator 41 rotates, the pulley 46B rotates through 42A, so that the arm 55 for a grindstone can rotate by 180° through the timing belt 48 and the pulley 47C. And, as shown in FIGS. 5 and 6, the grindstone may be nearly bead-shaped, or a bead-shaped abrasive grain 50A may be carved a little to the inside, that is, the shape of the grindstone should be appropriate for chamfering the outer periphery of the wafer.

Next, an explanation will be given of the operation of the slicing machine structured according to the present invention structured as described above with reference to FIG. 7. To make the present invention easier to be understood, in FIG. 7, a wafer 62 sliced from the ingot 10 is extremely thick, but the real thickness is less than 1 mm.

First, the index slider 20 holding the end of the ingot 10 moves in the direction D in FIG. 1 so as to set the slicing position of the ingot 10 at the position of the inner periphery blade 12. Next, when the feed table 28 moves in the direction A in FIG. 1, the ingot starts to be sliced. Since the base 32 of the chamfering machine 30 is fixed at the feed table 28, the grindstone 50 also moves synchronizing with the feeding of the ingot 10.

Figure 8:
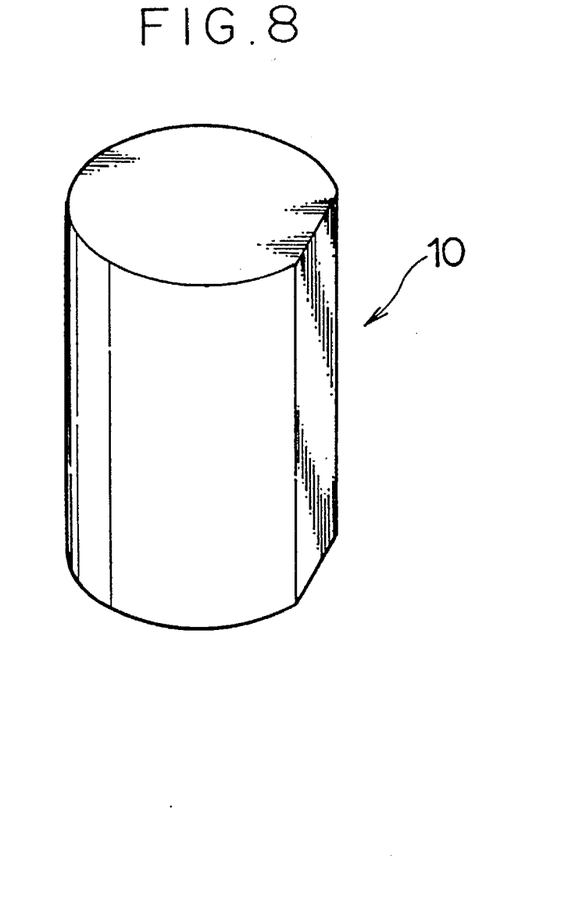
FIG. 8 is a perspective view of an ingot with an orientation flat.
Figure 9:
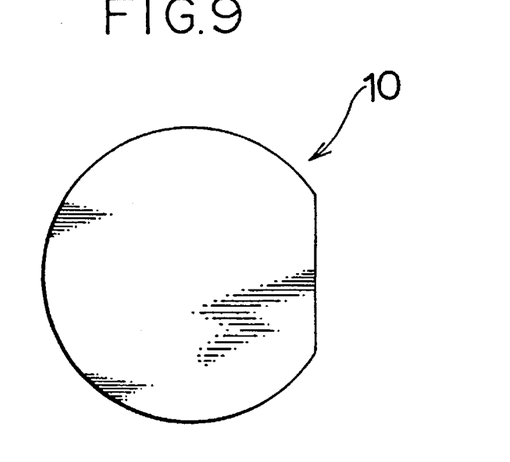
FIG. 9 is a plain view of FIG. 8 taken from above.

Next, when the feed table 28 further moves in the slicing direction at a predetermined distance and the ingot 10 is sliced halfway, the rotary actuator 41 works and the grindstone 50 rotates, so that the abrasive grain 50A of the grindstone 50 is located at the upper portion in the hole of the inner periphery blade 12. Further, the stepping motor 35 drives the slider 34 so that the grindstone 50 can abut against the outer periphery of the slicing groove 60 of the ingot 10, and the feeding of the slider 34 is performed so that the chamfering amount can be a predetermined one. During the chamfering, the grinding liquid is supplied to the grindstone 50 from a grinding liquid supplying nozzle, which is not shown in the drawing. As a result, the outer periphery of the slicing groove 60 of the ingot 10 is sliced as a V-shape by the shape of the abrasive grain 50A, so the wafer 62 sliced from the ingot 10 is sliced after being chamfered. FIG. 7 shows the wafer being sliced. And, when the grindstone 50 grinds the outer periphery of the slicing groove 60, the roller 57 contacts the outer periphery of the ingot 10 and is driven by the rotating ingot and copies the shape of the periphery surface of the ingot 10, so that the ingot with an orientation flat can be accurately chamfered as shown in FIGS. 8 and 9. And, it is also possible to adjust the cutting depth by adjusting the contacting force of the grindstone 50 without providing the roller 57.

And, as for the force by which the grindstone 50 contacts the slicing groove 60, the force can be generated when a flat spiral spring, etc. whose both ends are fixed at the rotation axis 53 fixed at the pulley 47C so that the grindstone 50 rotates to contact the slicing groove 60, or other ways can be accepted.

While the wafer 62 being sliced is chamfered, the inner periphery blade 12 continues to slice the ingot 10 and slices the wafer 62. It is also possible to stop slicing the ingot 10 temporarily when the wafer 62 is sliced by several millimeters and to start slicing again after the chamfering. Thus, the apparatus for manufacturing the wafer of the present invention has the function of slicing the ingot 10 into the wafer 62 and the function of chamfering the wafer 62 being sliced in one body, so that when the ingot 10 is sliced, the wafer 62 being sliced can be chamfered at the same time. And, if the apparatus for manufacturing of the present invention slices the ingot, roughly chamfers the wafer 62 being sliced, performs the lapping, and then carries out the final chamfering, the working process is easily realized, which is the most suitable for meeting the requirement for the mirror grinding surface of the wafer 62's chamfering portion. Accordingly, the efficiency in manufacturing the wafer can be improved. Moreover, since the ingot 10 is sliced while rotating, it is not necessary to glue the ingot to a slice base and peel the ingot, so the efficiency can be further raised. Incidentally, in this embodiment, the chamfering is performed while the ingot is sliced, but the invention should not limited to this, and it is also possible that before the ingot 10 starts to be sliced, the grindstone is pressed against the outer periphery of the slicing position to form a V-shaped groove along the outer periphery of the slicing position, and moreover, the chamfering can be started the moment the ingot starts to be sliced. And, as shown in FIG. 2, a wafer receiving dish 100 with an absorption pad 100A can be provided at the tip of the arm 40. An arm 100B for receiving dish 100 is turned, synchronizing with the turning wafer receiving dish 100, and the wafer receiving dish 100 is moved to the lower portion of the ingot 10 so as to receive the wafer 62.

As described above, according to the apparatus and the method for manufacturing the wafer of the present invention, while the ingot is pressed against the rotating blade to be sliced, the grindstone of the predetermined shape is pressed against the outer periphery of the slicing groove. Or, before the ingot starts to be sliced, the grindstone of the predetermined shape is pressed against the outer periphery of the slicing position, so that the V-shaped slicing groove is formed along the outer periphery of the slicing position. As a result, when the ingot is sliced, the wafer being sliced can be chamfered at the same time. Accordingly, the efficiency in manufacturing a wafer can be raised.

Further, if the apparatus for manufacturing the wafer of the present invention slices the ingot, roughly chamfers the wafer being sliced, performs the lapping after that, and carries out the final chamfering in the end, the working process can be realized which is the most suitable for meeting the requirement for the mirror grinding surface of the wafer's chamfering portion.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method for manufacturing a wafer in which a rotating ingot is pressed against a rotating blade so as to be sliced into sheet wafers, said method comprising pressing a grindstone having a shape predetermined for chamfering against an outer periphery of a slicing groove while the ingot is being sliced so as to chamfer the wafer being sliced.

2. A method for manufacturing a wafer in which a rotating ingot is pressed against a rotating blade so as to be sliced into sheet wafers, said method comprising forming a substantially V-shaped groove along an outer periphery of a slicing position by pressing a grindstone having a shape predetermined for chamfering against the slicing position before the ingot starts to be sliced so as to chamfer the wafer being sliced.

3. A method of manufacturing a wafer in which a rotating ingot is pressed against a rotating blade so as to be sliced into sheet wafers, said method comprising pressing a grindstone having a shape predetermined for chamfering against an outer periphery of a slicing groove to chamfer the wafer simultaneously with the slicing of said ingot.

4. An apparatus for manufacturing a wafer in which a rotating ingot is pressed against a rotating blade so as to be sliced into sheet wafers comprising:

a grindstone having a shape predetermined for chamfering;

rotating means for rotating the grindstone; and moving means for supporting the rotating grindstone and contacting the grindstone with the outer periphery of an ingot at a slicing position and retracting the grindstone to the outer periphery of said slicing position in the body of said ingot.

5. The apparatus for manufacturing a wafer as set forth in claim 4, wherein said grindstone is disk-shaped and the outer periphery thereof is outwardly V-shaped.

6. The apparatus for manufacturing a wafer as set forth in claim 5, wherein a pair of surfaces forming said V-shaped outer periphery are inwardly carved.

7. The apparatus for manufacturing a wafer as set forth in claim 4, further comprising copy means which follow a peripheral shape of said ingot.

8. The apparatus for manufacturing a wafer as set forth in claim 4, further comprising copy means including a roller supported by said moving means and which contacts the outer periphery of said ingot and is rotated by the rotational force of said ingot when said grindstone cuts the outer periphery of the slicing groove.

* * * * *